United States Patent
Lu et al.

(10) Patent No.: US 11,721,578 B2
(45) Date of Patent: Aug. 8, 2023

(54) SPLIT ASH PROCESSES FOR VIA FORMATION TO SUPPRESS DAMAGE TO LOW-K LAYERS

(71) Applicants: Tokyo Electron Limited, Tokyo (JP); International Business Machines Corporation, Armonk, NY (US)

(72) Inventors: Yen-Tien Lu, Albany, NY (US); Angelique Raley, Albany, NY (US); Joe Lee, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 165 days.

(21) Appl. No.: 17/088,136

(22) Filed: Nov. 3, 2020

(65) Prior Publication Data

US 2021/0151350 A1    May 20, 2021

Related U.S. Application Data

(60) Provisional application No. 62/936,981, filed on Nov. 18, 2019.

(51) Int. Cl.
*H01L 21/768* (2006.01)
*H01L 21/027* (2006.01)

(52) U.S. Cl.
CPC .... *H01L 21/76814* (2013.01); *H01L 21/0273* (2013.01); *H01L 21/76816* (2013.01); *H01L 21/76835* (2013.01)

(58) Field of Classification Search
CPC .......... H01L 21/76814; H01L 21/0273; H01L 21/76835; H01L 21/31138;
(Continued)

(56) References Cited

U.S. PATENT DOCUMENTS 7,601,641 B1    10/2009 Geiss et al.
8,138,093 B2 *   3/2012 Akinmade-Yusuff ........................
                                       H01L 21/0335
                                       438/700

(Continued)

FOREIGN PATENT DOCUMENTS

JP    2006173360 A    6/2006
KR    100909174 B1    7/2009

OTHER PUBLICATIONS

Korean Intellectual Property Office, The International Search Report and the Written Opinion for International application No. PCT/US2020/058694, dated Feb. 25, 2021, 8 pg.

*Primary Examiner* — Niluha Rahim

(57) ABSTRACT

Split ash processes are disclosed to suppress damage to low-dielectric-constant (low-K) layers during via formation. For one embodiment, ash processes used to remove an organic layer, such as an organic planarization layer (OPL), associated with via formation are split into multiple ash process steps that are separated by intervening process steps. A first ash process is performed to remove a portion of an organic layer after vias have been partially opened to a low-K layer. Subsequently, after the vias are fully opened through the low-K layer, an additional ash process is performed to remove the remaining organic material. Although some damage may still occur on via sidewalls due to this split ash processing, the damage is significantly reduced as compared to prior solutions, and device performance is improved. Target critical dimension (CD) for vias and effective dielectric constants for the low-K layer are achieved.

15 Claims, 8 Drawing Sheets

(58) Field of Classification Search
CPC ......... H01L 21/76802; H01L 21/31144; H01L 21/76816
See application file for complete search history.

(56) References Cited

U.S. PATENT DOCUMENTS

| | | | |
|---|---|---|---|
| 8,378,439 B2 | 2/2013 | Beck et al. | |
| 10,204,826 B1* | 2/2019 | Hsu | H01L 21/76877 |
| 2007/0224824 A1* | 9/2007 | Chen | H01L 21/31155 |
| | | | 438/700 |
| 2009/0075470 A1* | 3/2009 | Nitta | H01L 21/76808 |
| | | | 438/618 |
| 2011/0039413 A1* | 2/2011 | Akinmade-Yusuff | ............ |
| | | | H01L 21/0335 |
| | | | 438/700 |
| 2013/0005147 A1 | 1/2013 | Angyal et al. | |
| 2016/0027686 A1* | 1/2016 | Nitta | H01L 21/76831 |
| | | | 438/618 |
| 2017/0092580 A1* | 3/2017 | Huang | H01L 21/02019 |
| 2019/0123054 A1* | 4/2019 | Chen | H01L 27/11582 |
| 2020/0075405 A1* | 3/2020 | Huang | H01L 23/53257 |

\* cited by examiner

SPLIT ASH PROCESSES FOR VIA FORMATION TO SUPPRESS DAMAGE TO LOW-K LAYERS

CROSS REFERENCE TO RELATED PATENTS AND APPLICATIONS

This application claims priority to and the benefit of the filing date of U.S. Non-Provisional Patent Application No. 62/936,981, filed Nov. 18, 2019, which application is incorporated herein by reference in its entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, process flows are being requested to reduce feature size while maintaining structure integrity for various patterning processes.

As part of one conventional process for via formation, an organic layer, such as an organic planarization layer (OPL), is formed over a low-dielectric-constant (low-K) layer, and vias are formed through the organic layer and the low-K layer to underlying layers. This conventional process performs a single-step ash process to remove the organic layer after via formation, and this single-step ash process damages the low-K material along the via sidewalls.

FIGS. 1A-1J (Prior art) provide cross-section views of example embodiments for this conventional single-step ash process as part of via formation. For this back-end-of-line (BEOL) process, vias are opened through an organic layer, such as an OPL layer, and a hard mask (HM) layer to a low-K layer. The vias are subsequently opened through the low-K layer. A single-step ash process is then performed to remove the organic layer above the HM layer. However, this single-step ash process not only removes the organic layer but also damages the low-K layer along the via sidewalls. During a subsequent wet clean process, the damaged areas of the low-K layer are further etched and leave a critical dimension (CD) for the vias that is larger than the target CD. Further, the dielectric constant for the low-K material is effectively increased. This increase in the via CD and the effective dielectric constant for the low-K layer can cause degradation in performance for the devices being formed on the microelectronic workpiece.

Looking now to FIG. 1A (Prior Art), a cross-section diagram is provided of an example embodiment 100 for a stacked structure formed on a substrate for a microelectronic workpiece. Metal regions 104 have been formed and are included within a dielectric layer 102. A barrier low dielectric (k) (Blok) layer 106 and a low-K layer 108 have been formed over the metal regions 104 and the underlying dielectric layer 102. A hard mask (HM) layer 110, such as a sacrificial nitrogen (SacN) hard mask layer, and an organic layer 112, such as an OPL layer, are formed over the low-K layer 108. Further, a silicon-oxygen-nitrogen (SiON) layer 114 and a bottom anti-reflective coating (BARC) layer 116 are formed over the organic layer 112. A photoresist (PR) layer 118 has been formed above the BARC layer 116 and is patterned with a via pattern including vias 120 for via formation. As described in FIGS. 1B-1J, this incoming stacked structure is then processed to extend the vias 120 through the stacked structure.

FIG. 1B (Prior Art) is a cross-section diagram of an example embodiment 130 after an etch process has been performed to open the vias 120 through the BARC layer 116 and the SiON layer 114. This etch process step has also etched a portion of the PR layer 118 and has etched partially into the organic layer 112. The etch process can be implemented, for example, as one or more plasma etch process steps.

FIG. 1C (Prior Art) is a cross-section diagram of an example embodiment 135 after an etch process has been performed to extend the vias 120 through the organic layer 112 to the HM layer 110. Further, the PR layer 118 and the BARC layer 116 have also been removed. The etch process can be implemented, for example, as one or more plasma etch process steps.

FIG. 1D (Prior Art) is a cross-section diagram of an example embodiment 140 after an etch process has been performed to open the HM layer 110 within the vias 120 and to partially etch into the low-K layer 108. Further, the SiON layer 114 has also been removed. The etch process can be implemented, for example, as one or more plasma etch process steps.

FIG. 1E (Prior Art) is a cross-section diagram of an example embodiment 145 after a further etch process has been performed to open the low-K layer 108 within the vias to expose the Blok layer 106 within the vias 120. This further etch process to open the vias 120 through the low-K layer 108 also etches a portion of the organic layer 112 above the hard mask layer 110. The etch process can be implemented, for example, as one or more plasma etch process steps.

FIG. 1F (Prior Art) is a cross-section diagram of an example embodiment 150 after a further etch process has been performed to form recesses in the Blok layer 106 within the vias 120. This further etch process to form recesses in the Blok layer 106 also etches a portion of the organic layer 112 above the hard mask layer 110. The etch process can be implemented, for example, as one or more plasma etch process steps.

FIG. 1G (Prior Art) is a cross-section diagram of an example embodiment 155 after a single-step ash process has been performed to remove the organic layer 112. However, this single-step ash process not only removes the organic layer 112 but also damages regions 158 of the low-K layer 108 along the sidewalls of the vias 120. This damaged low-K material is undesirable.

FIG. 1H (Prior Art) is a cross-section diagram of an example embodiment 160 after an etch process has been performed to remove the HM layer 110. The damaged regions 158 of the low-K layer 108 along the sidewalls of the vias 120 still remain. The etch process can be implemented, for example, as one or more plasma etch process steps.

FIG. 1I (Prior Art) is a cross-section diagram of an example embodiment 165 after an etch process has been performed to remove the Blok layer 106 within the vias 120 along with a portion of the low-K layer 108. The resulting trench stops on the metal regions 104 formed within the dielectric layer 102. Portions of the damaged regions 158 of the low-K layer 108 along the sidewalls of the vias 120 still remain. The etch process can be implemented, for example, as one or more plasma etch process steps.

FIG. 1J (Prior Art) is a cross-section diagram of an example embodiment 170 after a wet clean process has been performed. This wet clean process removes the damaged regions 158 of the low-K layer 108 along the via sidewalls shown in FIG. 1I (Prior Art). The resulting CD for the vias 120 as represented by elements 172 is increased by the removal of these damaged regions 158, and this increased CD is larger than the desired target CD. Further, the effective dielectric constant for the low-K layer 108 can be increased, which is undesirable.

SUMMARY

Embodiments are described herein that provide split ash processes to suppress low-K damage during via formation. For one example embodiment, ash processes to remove an organic layer, such as an OPL layer, associated with via formation are split into multiple ash process steps that are separated by intervening process steps. A first ash process is performed to remove a portion of an organic layer after vias have been partially opened to a low-K layer. Subsequently, after the vias are fully opened through the low-K layer, an additional ash process is performed to remove the remaining organic material. Although some damage may still occur on via sidewalls due to this split ash processing, the damage is significantly reduced as compared to prior solutions, and device performance is improved. Target via CD and effective dielectric constants for the low-K layer are achieved. Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

As described herein, methods are disclosed that perform split ash processes to remove organic layers during via formation to suppress damage to low-K layers along via sidewalls. This suppression of damage to low-K layers reduces the degradation in CD and dielectric (K) parameters suffered by prior solutions after wet clean of the resulting structures. Other advantages and implementations can also be achieved while still taking advantage of the process techniques described herein.

FIGS. 2A-2J provide cross-section views of example embodiments for split ash processes to suppress damage to low-K layers during via formation as described herein. For this back-end-of-line (BEOL) process, vias are opened through an organic layer, such as an OPL layer, and through a hard mask (HM) layer to a low-K layer. A first ash process step is performed to remove a portion of the organic layer above the HM layer. The vias are further opened through the low-K layer. An additional ash process step is then performed to remove the organic layer. Although this additional ash process step may cause some damage to the low-K material along the via sidewalls, this damage is significantly less than prior solutions due to the split ash processing. After a subsequent wet clean process, the damaged areas of the low-K material are further etched and leave a critical dimension (CD) for the vias that is closer to or achieves a target CD for the vias. Further, increases to the effective dielectric constant for the low-K material is reduced or eliminated as compared to prior solutions, and an effective target dielectric constant is achieved for the low-K layer. The improved via CD and dielectric constant parameters improve device performance as compared to prior solutions that use single-step ash processes to remove organic layers during via formation as described above.

Figure 1A:
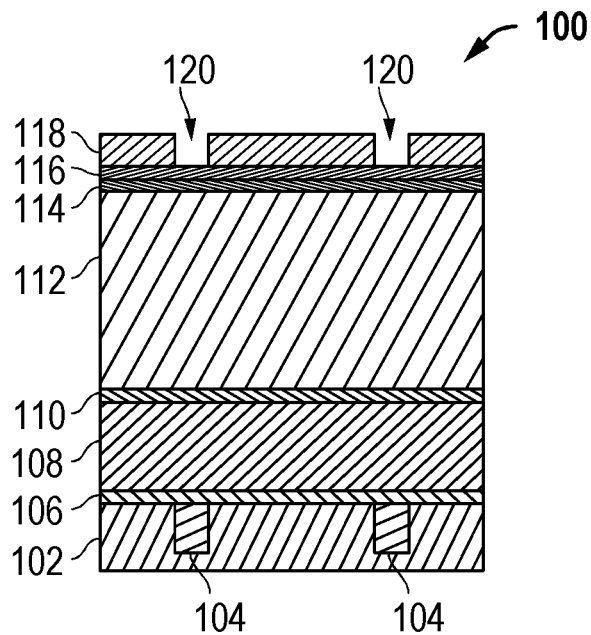
FIGS. 1A-1J (Prior Art) provide cross-section views of example embodiments for a conventional single-step ash process as part of via formation.
Figure 1B:
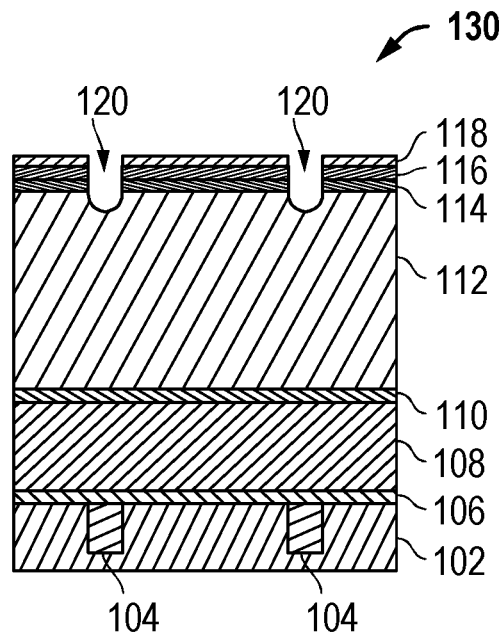
Figure 1C:
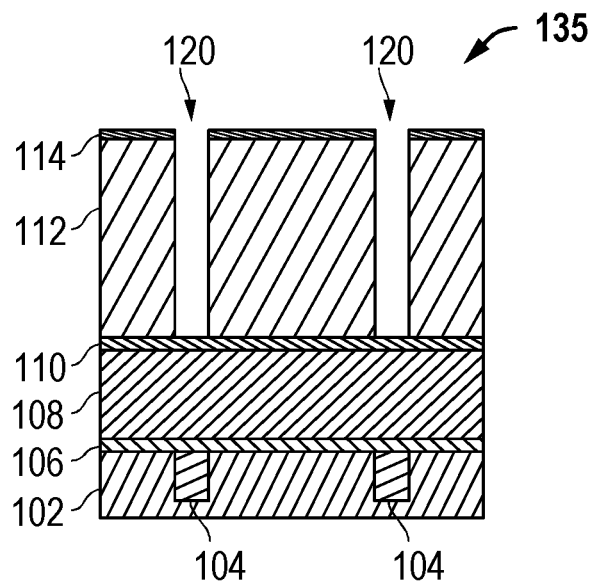
Figure 1D:
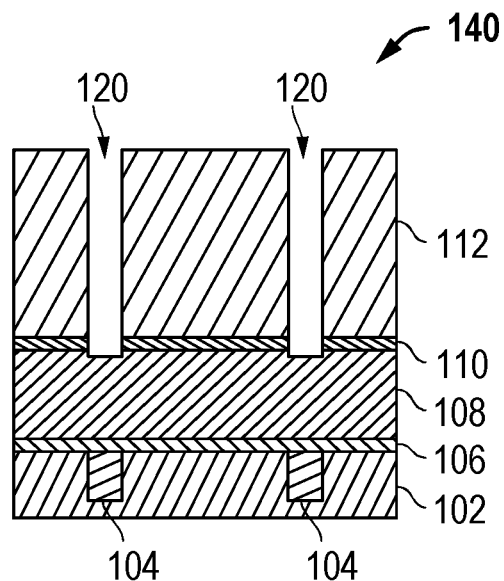
Figure 1E:
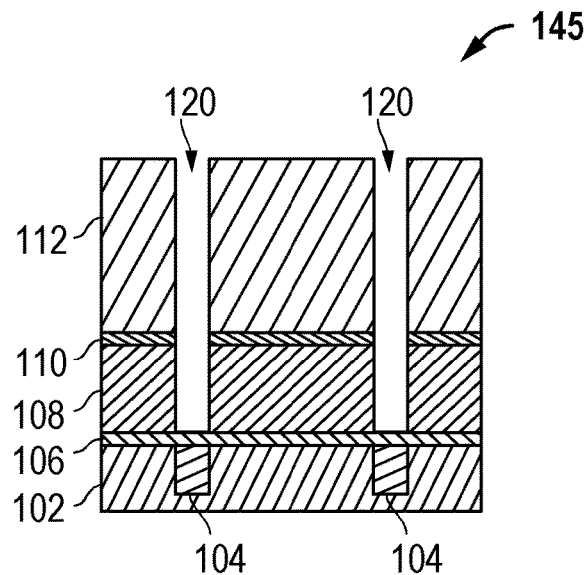
Figure 1F:
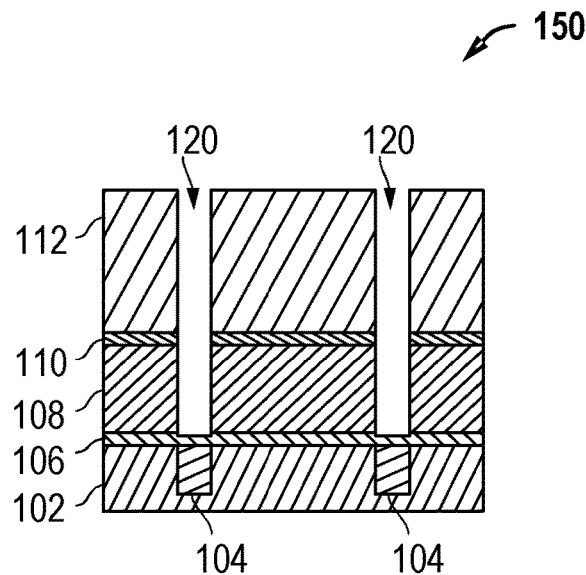
Figure 1G:
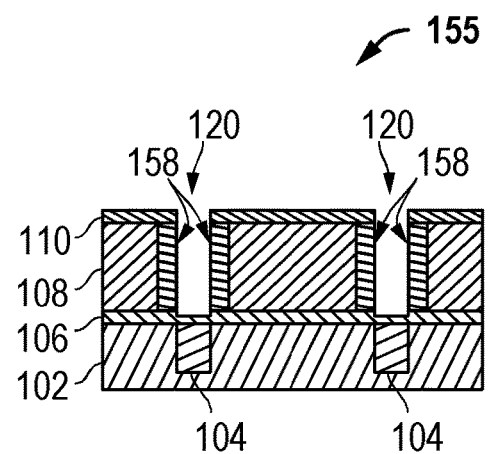
Figure 1H:
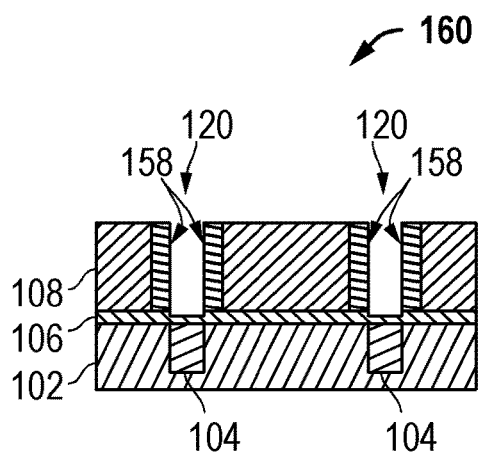
Figure 1I:
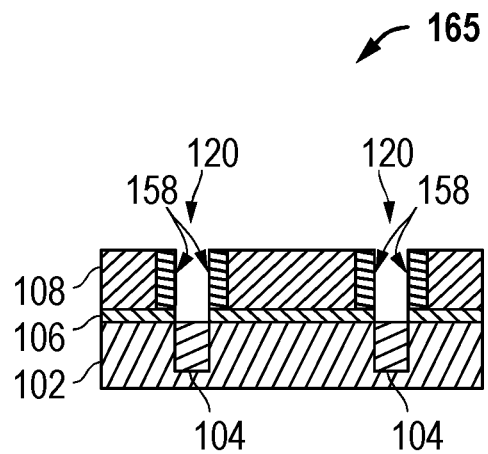
Figure 1J:
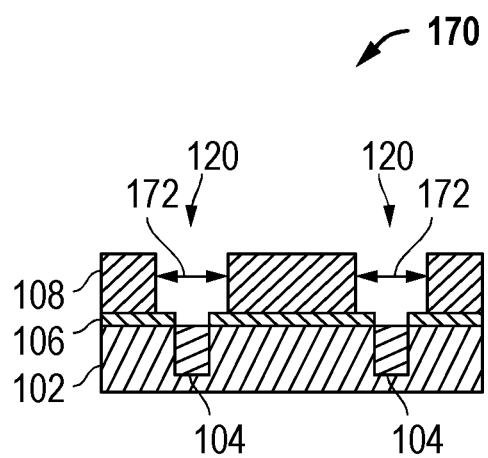
Figure 2A:
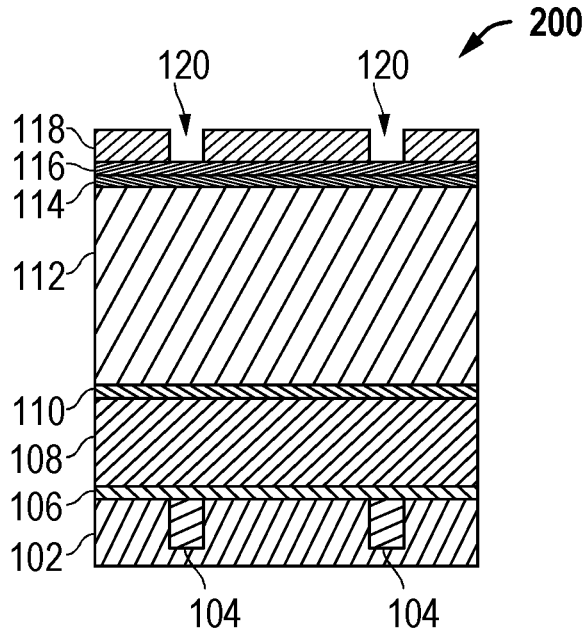
FIGS. 2A-2K provide cross-section views of example embodiments for split ash processes to suppress damage to low-K layers during via formation FIG. 3 provides a process flow diagram of an example embodiment for a split ash process to reduce damage to low-K layers during via formation

Looking now to FIG. 2A, a cross-section diagram is provided of an example embodiment 200 for a stacked structure formed on a substrate for a microelectronic workpiece. The embodiment 200 matches the embodiment 100 of FIG. 1A (Prior Art). Metal regions 104 have been formed and are included within a dielectric layer 102. A barrier low dielectric (k) (Blok) layer 106 and a low-K layer 108 have been formed over the metal regions 104 and the underlying dielectric layer 102. A hard mask (HM) layer 110, such as a sacrificial nitrogen (SacN) hard mask layer, and an organic layer 112, such as an OPL layer, are formed over the low-K layer 108. Further, a silicon-oxygen-nitrogen (SiON) layer 114 and a bottom anti-reflective coating (BARC) layer 116 are formed over the organic layer 112. A photoresist (PR) layer 118 has been formed about the BARC layer 116 and is patterned with a via pattern for formation of vias 120. In contrast with the steps shown in FIGS. 1B-1J (Prior Art) and as described further below, this incoming stack structure shown in FIG. 2A is processed using split ash processes for via formation as described herein, and this split ash processing improves resulting CD and/or dielectric parameters.

Figure 2B:
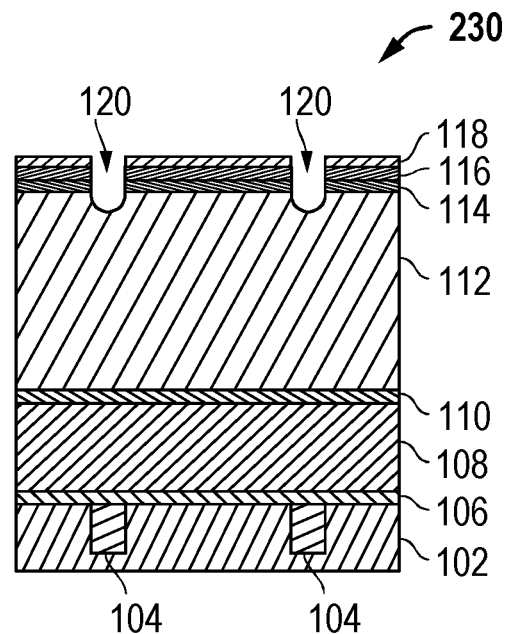

FIG. 2B is a cross-section diagram of an example embodiment 230 after an etch process has been performed to open the vias 120 through the BARC layer 116 and the SiON layer 114. This etch process step has also etched a portion of the PR layer 118 and has etched partially into the organic layer 112. The etch process can be implemented, for example, as one or more plasma etch process steps. The embodiment 230 of FIG. 2B matches embodiment 130 of FIG. 1B (Prior Art).

Figure 2C:
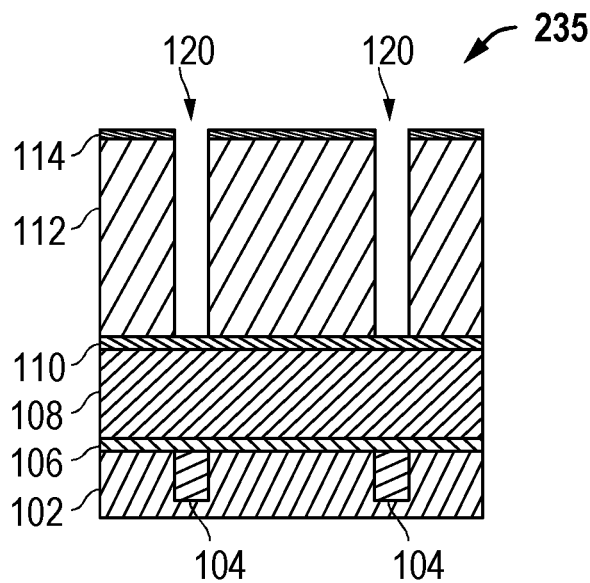

FIG. 2C is a cross-section diagram of an example embodiment 235 after an etch process has been performed to extend the vias 120 through the organic layer 112 to the HM layer 110. Further, the PR layer 118 and the BARC layer 116 have also been removed. The etch process can be implemented, for example, as one or more plasma etch process steps. The embodiment 235 of FIG. 2C matches embodiment 135 of FIG. 1C (Prior Art).

Figure 2D:
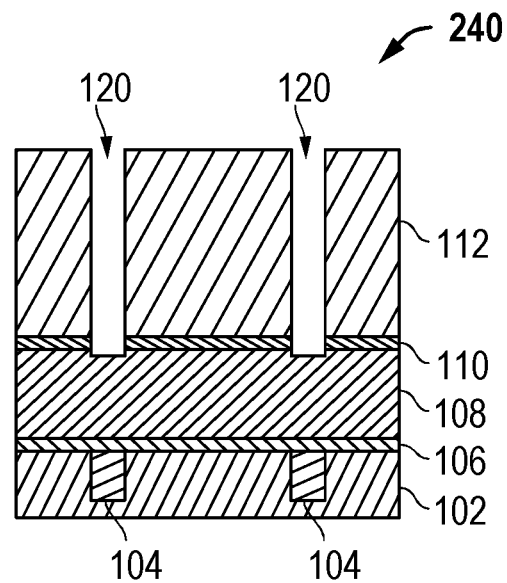

FIG. 2D is a cross-section diagram of an example embodiment 240 after an etch process has been performed to open the HM layer 110 within the vias 120 and to partially etch into the low-K layer 108. Further, the SiON layer 114 has also been removed. The etch process can be implemented, for example, as one or more plasma etch process steps. The embodiment 240 of FIG. 2D matches embodiment 140 of FIG. 1D (Prior Art).

It is again noted that the embodiments of FIGS. 2A-2D match the embodiments of FIGS. 1A-1D (Prior Art) above.

However, unlike prior solutions and as described further below, split ash processes are performed during via formation as shown in FIGS. 2E-2K. For example, a first ash process step is performed in FIG. 2E to remove a portion of the organic layer prior to opening the vias fully through the low-K layer. After intervening process steps, an additional ash process step is then performed in FIG. 2H to remove the remaining organic layer.

Figure 2E:
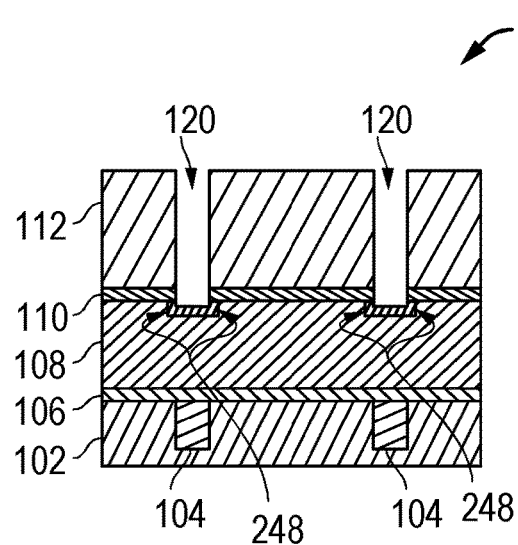

Looking now to FIG. 2E, a cross-section diagram is provided of an example embodiment 245 after a first ash process has been performed to remove a portion of the organic layer 112. This first ash process also causes damage to the low-K layer 108 in a thin and shallow region within the surface of the low-K layer 108 within the vias 120. This damage, however, is limited to the top portions 248 of the low-K layer 108 along the via sidewalls.

Figure 2F:
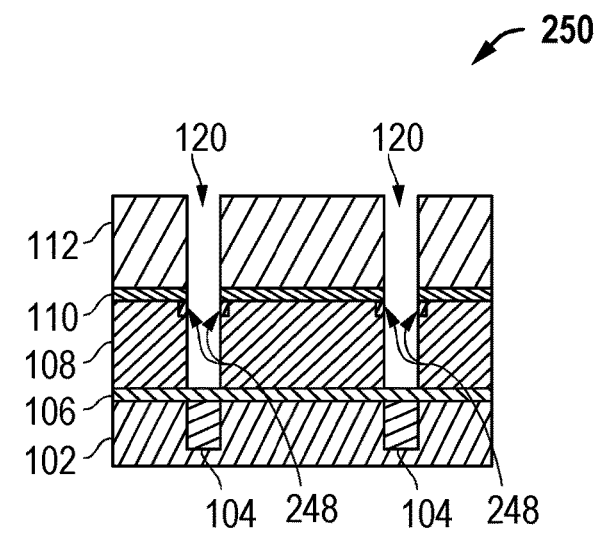

FIG. 2F is a cross-section diagram of an example embodiment 250 after a further etch process has been performed to open the low-K layer 108 within the vias 120 to expose the Blok layer 106 within the vias 120. This further etch process to open the vias 120 through the low-K layer 108 also etches a portion of the organic layer 112 above the HM layer 110. The damaged top portions 248 of the low-K layer 108 along the via sidewalls still remain. The etch process can be implemented, for example, as one or more plasma etch process steps.

Figure 2G:
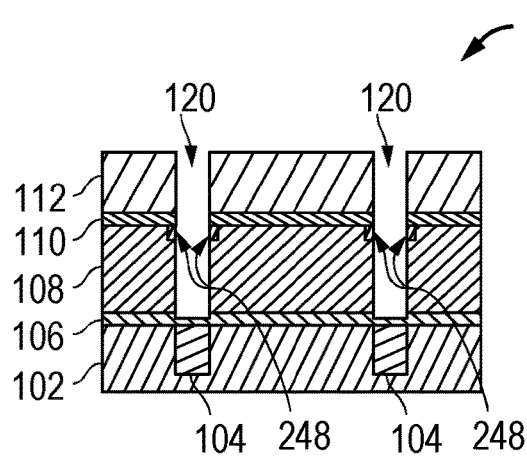

FIG. 2G is a cross-section diagram of an example embodiment 255 after a further etch process has been performed to form recesses in the Blok layer 106 with the vias 120. This further etch process to form recesses in the Blok layer 106 also etches a portion of the organic layer 112 above the HM layer. The damaged top portions 248 of the low-K layer 108 along the via sidewalls still remain. The etch process can be implemented, for example, as one or more plasma etch process steps.

Figure 2H:
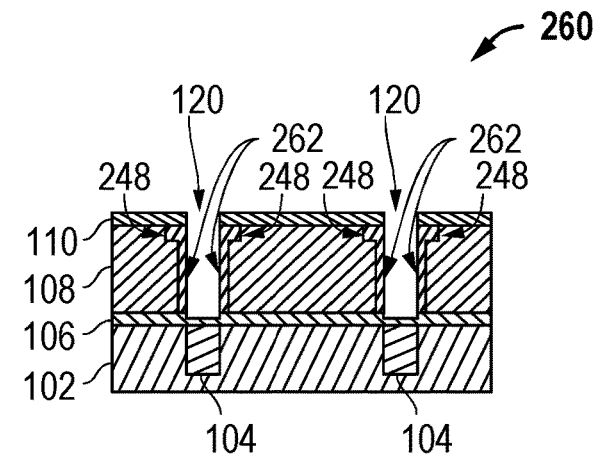

FIG. 2H is a cross-section diagram of an example embodiment 260 after an additional ash process has been performed to remove the organic layer 112. While this additional ash process may cause some damage to sidewall regions 262 for the low-K layer 108 along the via sidewalls, this damage is reduced as compared to prior solutions that use single-step ash processing. A comparison of the sidewall regions 262 shown in FIG. 2H as compared to the damaged regions 158 shown in FIG. 1G provides a representative example for the reduced damage achieved by the split ash processing of the current embodiments.

It is noted that this reduction in damage is due in part to the reduced processing time required to remove the remaining portion of the organic layer 112 shown in FIG. 2G. This processing time is reduced because a first portion of the organic layer 112 was initially removed in the first ash process in FIG. 2E. It is further noted that the top portions 248 of the low-K layer 108 has increased damage as compared to the remaining portions of the sidewall regions 262. However, the top portions 248 will be removed and not degrade the resulting CD for the vias as shown in FIGS. 2J-2K below.

Figure 2I:
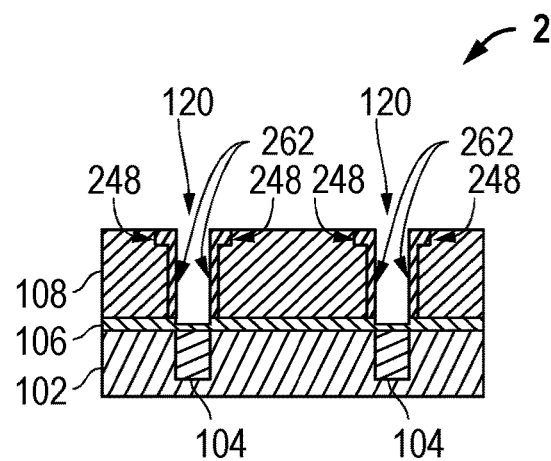

FIG. 2I is a cross-section diagram of an example embodiment 265 after an etch process has been performed to remove the HM layer 110. The damaged top portions 248 of the low-K layer 108 along the via sidewalls and the damaged sidewall regions 262 for the low-K layer 108 still remain. The etch process can be implemented, for example, as one or more plasma etch process steps.

Figure 2J:
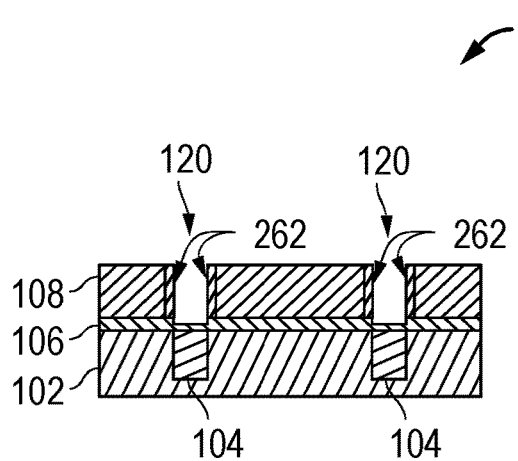

FIG. 2J is a cross-section diagram of an example embodiment 270 after an etch process has been performed to remove the Blok layer 106 within the vias 120 along with a portion of the low-K layer 108. The resulting trench stops on the metal regions 104 formed within the dielectric layer 102. Further, the more damaged top portions 248 of the low-K layer 108 at the top of the via sidewalls are removed. The less damaged portions of sidewall regions 262 at the bottom portions of the low-K layer 108 remain. As described above with respect to FIG. 2H, this damage to the sidewall regions 262 resulting from the additional split ash process is significantly less than the damage experienced by prior single-step ash processing solutions.

Figure 2K:
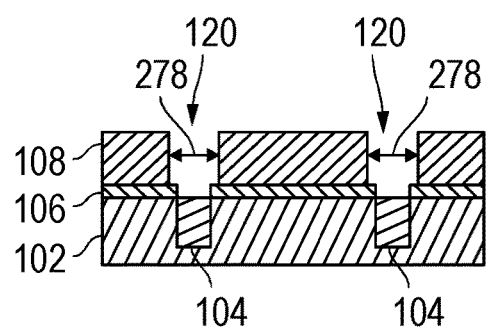

FIG. 2K is a cross-section diagram of an example embodiment 275 after a subsequent wet clean process. The damaged sidewall regions 262 of the low-K layer 108 along with via sidewalls has been removed. Because these damaged portions of the low-K layer 108 are reduced as compared to prior solutions, the resulting CD for the vias 120 as represented by elements 278 is improved. A comparison of the via CD represented by elements 278 in FIG. 2K as compared to the increased via CD shown by elements 172 in FIG. 1J (Prior Art) provides a representative example if this reduced degradation in via CD achieved by the current embodiments. Because degradation in CD for the vias 120 is reduced, the split ash processing described herein allows for target CDs to be achieved. Further, target dielectric constants (K) for the low-K layer 108 can also be achieved due the reduction in damage to the low-K layer 108 along the sidewalls of the vias 120. Other advantages can also be achieved.

It is noted that various materials can be used for the layers described herein with respect to FIGS. 2A-2K while still taking advantage of the split ash processing techniques described herein. For example, the organic layer 112 can be an OPL layer, a spin-on carbon (SoC) layer, and/or a layer of another selected organic material or combination of materials. The low-K layer 108 can be, for example, a layer of SiCOH, a layer of SiNCH, and/or a layer of another selected low-K material or combination of materials. Additional materials and variations can also be used.

It is further noted that for the embodiments described herein with respect to FIGS. 2A-2K, one or more process variables are preferably controlled during operation to achieve target process parameters for the processing of microelectronic workpieces as described herein. For example, one or more etch process variables, ash process variables, and/or other process variables can be controlled to achieve target process parameters. These target process parameters can include, for example, a target CD for the vias, target levels for damage reduction in low-K material along the via sidewalls, target damage levels for the low-K materials, target dielectric constants for the low-K material, and/or to other target process parameters.

Figure 3:
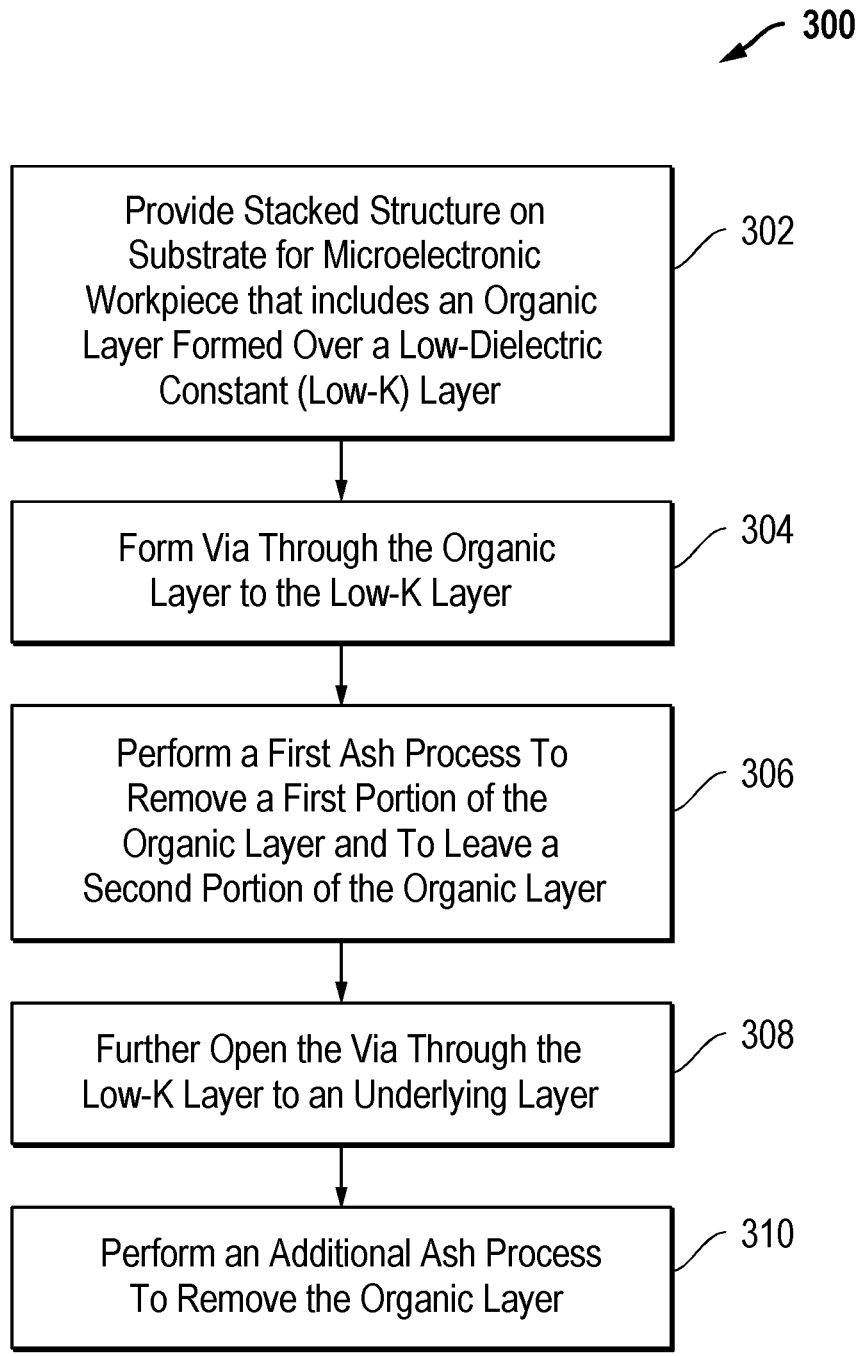

FIG. 3 is a process flow diagram of an example embodiment 300 for a split ash process to reduce damage to low-K layers during via formation. In block 302, a stacked structure is provided on a substrate for a microelectronic workpiece, and the stacked structure includes an organic layer 112 formed over a low-dielectric-constant (low-K) layer 108. In block 304, a via 120 is formed through the organic layer 112 to the low-K layer 108. In block 306, a first ash process is performed to remove a first portion of the organic layer 112 and to leave a second portion of the organic layer 112. As described above, this first ash process will cause damage to top portions 248 of the low-K layer 108 along the sidewalls of the vias 120. In block 308, the vias 120 are further opened through the low-K layer 108 to an underlying layer. In block 310, an additional ash process is performed to remove the organic layer 112. As described above, this additional ash process step will cause some damage to sidewall regions 262 for the low-K layer 108 along the via sidewalls. This damage, however, is reduced as compared to prior solutions that use single-step ash processing. It is noted that additional or different process steps can also be used while still taking advantage of the split ash processing techniques described herein.

It is further noted that the techniques described herein may be utilized with a wide range of processing systems including plasma processing systems. For example, the techniques may be utilized with plasma etch process systems, plasma deposition process systems, or any other plasma process system.

Figure 4:
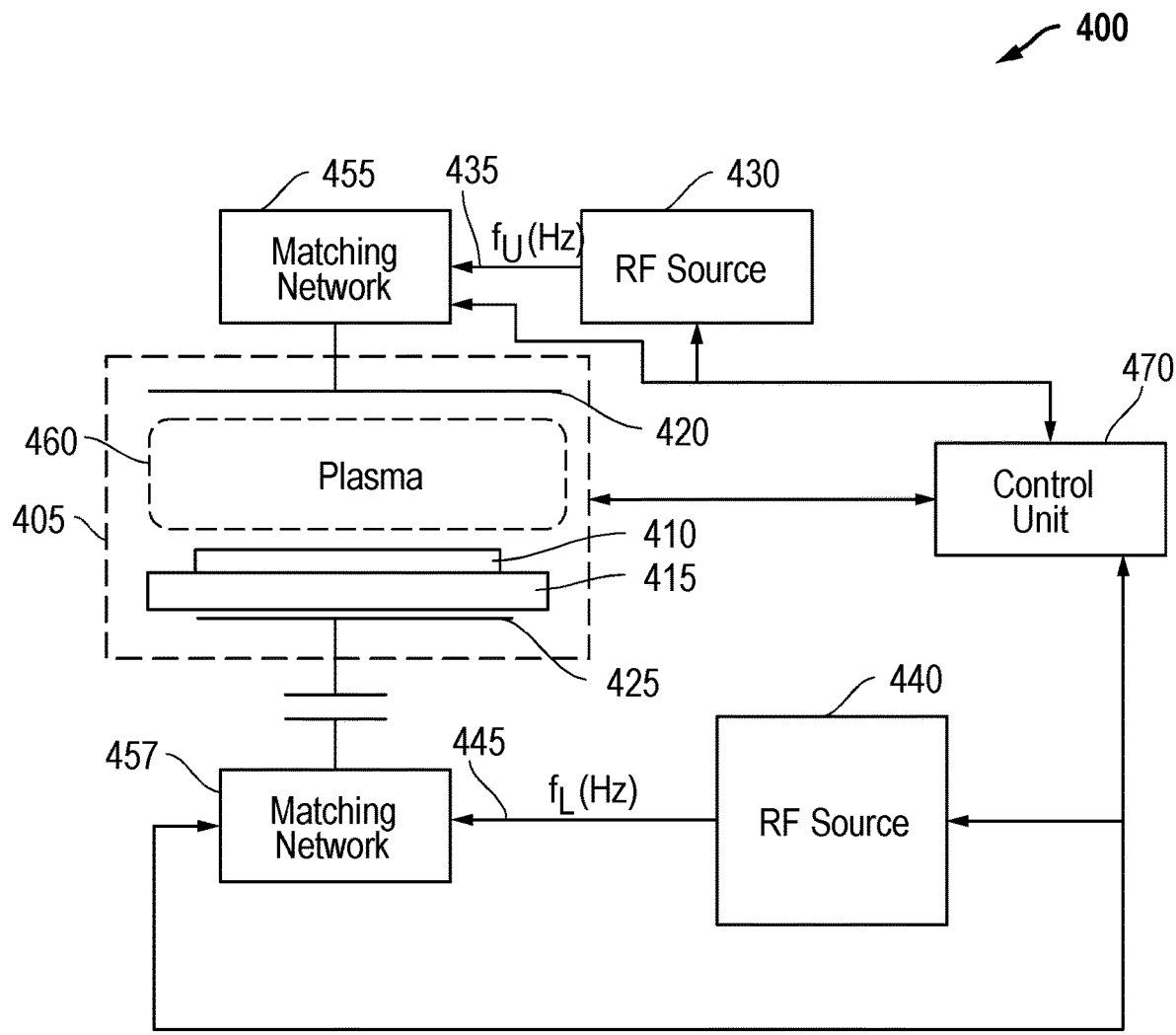
FIG. 4 is a diagram of an example embodiment for a plasma processing system that can be used with respect to the processing techniques described herein.

FIG. 4 provides one example embodiment for a plasma processing system 400 that can be used with respect to the disclosed techniques and is provided only for illustrative purposes. The plasma processing system 400 may be a capacitively coupled plasma processing apparatus, inductively coupled plasma processing apparatus, microwave plasma processing apparatus, Radial Line Slot Antenna (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems. The plasma processing system 400 can be used for a wide variety of operations including, but not limited to, etching, deposition, cleaning, plasma polymerization, plasma-enhanced chemical vapor deposition (PECVD), atomic layer deposition (ALD), atomic layer etch (ALE), and so forth. The structure of a plasma processing system 400 is well known, and the particular structure provided herein is merely of illustrative purposes. It will be recognized that different and/or additional plasma process systems may be implemented while still taking advantage of the techniques described herein.

Looking in more detail to FIG. 4, the plasma processing system 400 may include a process chamber 405. As is known in the art, process chamber 405 may be a pressure controlled chamber. A substrate 410 (in one example a semiconductor wafer) may be held on a stage or chuck 415. An upper electrode 420 and a lower electrode 425 may be provided as shown. The upper electrode 420 may be electrically coupled to an upper radio frequency (RF) source 430 through an upper matching network 455. The upper RF source 430 may provide an upper frequency voltage 435 at an upper frequency ($f_U$). The lower electrode 425 may be electrically coupled to a lower RF source 440 through a lower matching network 457. The lower RF source 440 may provide a lower frequency voltage 445 at a lower frequency ($f_L$). Though not shown, it will be known by those skilled in the art that a voltage may also be applied to the chuck 415.

Components of the plasma processing system 400 can be connected to, and controlled by, a control unit 470 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that since control unit 470 may be coupled to various components of the plasma processing system 400 to receive inputs from and provide outputs to the components.

The control unit 470 can be implemented in a wide variety of manners. For example, the control unit 470 may be a computer. In another example, the control unit may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 460 in the process chamber 405 when applying power to the system from the upper radio frequency (RF) source 430 and the lower RF source 440. Further, as is known in the art, ions generated in the plasma 460 may be attracted to the substrate 410. The generated plasma can be used for processing a target substrate (such as substrate 410 or any material to be processed) in various types of treatments such as, but not limited to, plasma etching, chemical vapor deposition, treatment of semiconductor material, glass material and large panels such as thin-film solar cells, other photovoltaic cells, organic/inorganic plates for flat panel displays, and/or other applications, devices, or systems.

Application of power results in a high-frequency electric field being generated between the upper electrode 420 and the lower electrode 425. Processing gas delivered to process chamber 405 can then be dissociated and converted into a plasma. As shown in FIG. 4, the exemplary system described utilizes both upper and lower RF sources. For example, high-frequency electric power, for an exemplary capacitively coupled plasma system, in a range from about 3 MHz to 150 MHz or above may be applied from the upper RF source 430 and a low frequency electric power in a range from about 0.2 MHz to 40 MHz can be applied from the lower RF source. Different operational ranges can also be used. Further, it will be recognized that the techniques described herein may be utilized with in a variety of other plasma systems. In one example system, the sources may switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.)

at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire. ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:
1. A method for via formation, comprising:
providing a stacked structure on a substrate for a microelectronic workpiece, the stacked structure comprising an organic layer formed over a low-dielectric-constant (low-K) layer;
forming a via through the organic layer to the low-K layer, wherein the forming etches the via into a top portion of the low-K layer;
performing a first ash process to remove a first portion of the organic layer and to leave a second portion of the organic layer, wherein the first ash process causes damage to the top portion of the low-K layer along sidewalls for the via to form a damaged top portion of the low-K layer;
further opening the via through the low-K layer to an underlying layer; and
performing an additional ash process to remove the second portion of the organic layer, wherein the additional ash process causes damage to the low-K layer along sidewalls for the via to form damaged sidewall regions such that the damaged sidewall regions extend in a lateral direction to a lesser extent than the damaged top portions;
performing an etch process, after the additional ash process, that removes the damaged top portions of the low-K layer, wherein the etch process leaves at least a portion of the damaged sidewall regions; and performing a wet clean process to remove the damaged sidewall regions.

2. The method of claim 1, wherein the organic layer comprises an organic planarization layer (OPL).

3. The method of claim 1, wherein a target critical dimension (CD) for the via is achieved.

4. The method of claim 1, wherein an effective target dielectric constant is achieved for the low-K layer.

5. The method of claim 1, wherein the stacked structure comprises a hard mask layer formed between the organic layer and the low-K layer.

6. The method of claim 5, wherein the further opening comprises extending the via through the hard mask layer and the low-K layer.

7. The method of claim 1, wherein the forming comprises one or more etch process steps and the further opening comprises one or more etch process steps.

8. The method of claim 7, wherein the one or more etch process are plasma etch process steps.

9. The method of claim 8, wherein the photoresist layer is patterned with a via pattern.

10. The method of claim 1, wherein the underlying layer comprises a dielectric layer including one or more metal regions.

11. The method of claim 1, wherein the stacked structure comprises a photoresist layer and one or more additional layers formed over the organic layer.

12. The method of claim 1, wherein the further opening comprises a plurality of etch processes, each etch process removing a portion of the organic layer.

13. The method of claim 1, further comprising controlling one or more process variables for the forming, performing, further opening, and performing steps to achieve one or more target process parameters.

14. The method of claim 13, wherein the target process parameters comprise at least one of damage reduction in the low-K layer along via sidewalls, a damage level for the low-K layer, and a dielectric constant for the low-K layer.

15. The method of claim 13, wherein the target process parameters comprise a target critical dimension (CD) for the via.

* * * * *